US012782451B2

(12) United States Patent
Bharathraj et al.

(10) Patent No.: US 12,782,451 B2
(45) Date of Patent: Nov. 3, 2026

(54) METHOD AND DEVICE WITH BATTERY SHORT RESISTANCE ESTIMATION

(71) Applicant: SAMSUNG ELECTRONICS CO., LTD., Suwon-si (KR)

(72) Inventors: Sagar Bharathraj, Bengaluru (IN); Shashishekara Parampalli Adiga, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 174 days.

(21) Appl. No.: 18/743,850

(22) Filed: Jun. 14, 2024

(65) Prior Publication Data

US 2025/0004064 A1 Jan. 2, 2025

(30) Foreign Application Priority Data

Jun. 27, 2023 (IN) ............................. 202341043174
Oct. 16, 2023 (KR) ........................ 10-2023-0138045

(51) Int. Cl.
*G01R 31/389* (2019.01)
*G01R 31/367* (2019.01)
(Continued)

(52) U.S. Cl.
CPC ......... *G01R 31/389* (2019.01); *G01R 31/367* (2019.01); *G01R 31/371* (2019.01); *G01R 31/52* (2020.01); *H02J 7/80* (2026.01)

(58) Field of Classification Search
CPC ................ G01R 31/371; G01R 31/389; G01R 31/367; G01R 31/392; G01R 31/52
See application file for complete search history.

(56) References Cited

U.S. PATENT DOCUMENTS 6,832,171 B2 * 12/2004 Barsoukov ........... G01R 31/389 702/65
8,482,254 B2 * 7/2013 Ho ....................... G01R 31/389 320/132
(Continued)

FOREIGN PATENT DOCUMENTS

CN 107045109 A 8/2017
CN 111142035 A 5/2020
(Continued)

OTHER PUBLICATIONS

Korean Office Action issued on Mar. 18, 2025, in corresponding Korean Patent Application No. 10-2023-0138045. (5pages in English, 8pages in Korean).
(Continued)

*Primary Examiner* — Tung X Nguyen
(74) *Attorney, Agent, or Firm* — NSIP Law

(57) ABSTRACT

A processor-implemented method includes monitoring a plurality of direct current (DC) resistance values of a battery for a predefined time period during one of a constant power charging or discharging window of the battery, determining the plurality of DC resistance values of the battery at a plurality of timestamps corresponding to the predefined time period, determining a deviation of the determined plurality of DC resistance values by comparing the determined plurality of DC resistance values with a plurality of predefined DC resistance values associated with a reference battery, detecting a persistent short circuit in the battery in response to the determined deviation of the determined plurality of DC resistance values being greater than a threshold value, and estimating, in response to detecting the persistent short circuit in the battery, a short resistance of the battery based on a value of power supply in the constant power charging or discharging window and a magnitude of the determined
(Continued)

deviation of the determined plurality of DC resistance values with respect to the plurality of predefined DC resistance values.

20 Claims, 13 Drawing Sheets

(51) Int. Cl.

| | |
|---|---|
| ***G01R 31/371*** | (2019.01) |
| ***G01R 31/52*** | (2020.01) |
| ***H02J 7/80*** | (2026.01) |

(56) References Cited

U.S. PATENT DOCUMENTS

| | | | | |
|---|---|---|---|---|
| 2014/0159908 | A1* | 6/2014 | Hong | G01R 31/52 702/58 |
| 2022/0200293 | A1 | 6/2022 | Lee et al. | |

FOREIGN PATENT DOCUMENTS

| | | | |
|---|---|---|---|
| CN | 113253120 | A | 8/2021 |
| CN | 114545271 | A | 5/2022 |
| CN | 115684942 | A | 2/2023 |
| EP | 3 943 961 | A1 | 1/2022 |
| KR | 10-2021-0099504 | A | 8/2021 |
| KR | 10-2023-0069786 | A | 5/2023 |

OTHER PUBLICATIONS

Ouyang, Minggao et al., " Internal short circuit detection for battery pack using equivalent parameter and consistency method ", Journal of Power Sources, ScienceDirect, vol. 294, Oct. 30, 2015 (pp. 1-7).
Indian Office Action issued on Jun. 17, 2026, in counterpart Indian Patent Application No. 202341043174 (14 pages in dual-text English and Hindi).

* cited by examiner

METHOD AND DEVICE WITH BATTERY SHORT RESISTANCE ESTIMATION

CROSS-REFERENCE TO RELATED APPLICATIONS

This application claims the benefit under 35 USC § 119(a) of Indian Patent Application No. 202341043174 filed on Jun. 27, 2023 in the Indian Patent Office, and Korean Patent Application No. 10-2023-0138045 filed on Oct. 16, 2023 in the Korean Intellectual Property Office, the entire disclosures of which are incorporated herein by reference for all purposes.

BACKGROUND

1. Field

The present description relates to a method and device with battery short resistance estimation.

2. Description of Related Art

A battery may play a fundamental role in a majority of electronic devices to provide the necessary power supply that enables the electronic devices to function effectively. For acting as a self-contained electrochemical device, the battery may be designed to store chemical energy and convert the chemical energy into electrical energy. The electrical energy may be essential for energizing electronic circuits and components of the electronic devices. In modern times, batteries have evolved to meet the diverse needs of the electronic devices. The batteries are now available in various sizes, shapes, and capacities, allowing for greater flexibility and compatibility with different types of devices. For example, smaller devices, such as smartphones and wearable gadgets may use compact batteries that can fit within a limited space. In contrast, larger devices like laptops and electric vehicles may use higher-capacity batteries to support high power demands over extended periods.

The battery may be broadly classified mainly into two types, a disposable battery and a rechargeable battery (or secondary battery). The disposable battery is typically used only once and discarded thereafter. In contrast, the rechargeable battery may be reused multiple times by recharging the battery using an external power source. Among various types of rechargeable batteries, lithium-ion (Li-ion) rechargeable batteries may be most cost-effective and environmentally friendly in a long run. Li-ion batteries gained popularity due to their high energy density and longer lifespan and are widely used in various electronic devices.

However, a short circuit may happen in the rechargeable battery due to unintentional electrical contact between a positive terminal and a negative terminal of the rechargeable battery. In short circuit conditions, a resistance of the electrical contact between a positive terminal and a negative terminal of a battery may be referred to as a short resistance. A higher value of the short resistance may permit a low amount of current to flow through the short circuit, whereas a lower value of the short resistance may permit a high amount of current to flow through the short circuit. Thus, for the lower value of the short resistance, a large amount of thermal energy may be released because of the high amount of current flowing between the positive terminal and the negative terminal. Further, the short circuit may cause additional chain reactions, like electrolyte decomposition, and may result in a loss of active material. As a result, the temperature of the battery may increase. Therefore, the short circuit may result in a rapid discharge of energy, causing excessive heat buildup and may potentially lead to damage, failure, or even fire in the rechargeable battery.

To overcome the damage or failure of the battery, when the short circuit is detected at an early stage, then the battery may be replaced to prevent the electronic device from a thermal run-away event. However, when the short circuit is detected at very later stages, then the thermal run-away event may occur, and the electronic device may get damaged due to the uncontrollable overheating of the battery. Furthermore, in the case of the occurrence of a thermal run-away event, the electronic device may shut down to isolate the battery from the electronic device.

Further, short circuit determination may be very challenging at the early life stages of the battery as signatures for determining the short circuit at this stage are very weak. The persistent short circuit relates to the short circuit which is continuously present in the battery and is not intermittent.

Further, the techniques may only detect the persistent short circuit at later stages of short resistance (for example, 100Ω or less than 100Ω) with a maximum of 85% accuracy and are unable to detect any soft short.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one or more general aspects, a processor-implemented method includes: monitoring a plurality of direct current (DC) resistance values of a battery for a predefined time period during one of a constant power charging or discharging window of the battery; determining the plurality of DC resistance values of the battery at a plurality of timestamps corresponding to the predefined time period; determining a deviation of the determined plurality of DC resistance values by comparing the determined plurality of DC resistance values with a plurality of predefined DC resistance values associated with a reference battery; detecting a persistent short circuit in the battery in response to the determined deviation of the determined plurality of DC resistance values being greater than a threshold value; and estimating, in response to detecting the persistent short circuit in the battery, a short resistance of the battery based on a value of power supply in the constant power charging or discharging window and a magnitude of the determined deviation of the determined plurality of DC resistance values with respect to the plurality of predefined DC resistance values.

The method may include detecting that the persistent short circuit is not present in the battery, in response to the determined deviation of the plurality of DC resistance values being less than the threshold value.

The monitoring of the plurality of DC resistance values in the constant power charging or discharging window may include initiating the monitoring from a preset cell voltage value for a preset duration.

The reference battery may correspond to a healthy battery with the plurality of predefined DC resistance values during the predefined constant power charging or discharging window.

The estimating of the short resistance of the battery may include determining, using an electrochemical-thermal model, the short resistance based on the value of power supply in the constant power and the magnitude of the determined deviation of the determined plurality of DC resistance values with respect to the plurality of predefined DC resistance values at predefined reference operating conditions.

The detecting of the persistent short circuit in the battery may include: determining a first curve based on the plurality of predefined DC resistance values with respect to the corresponding timestamp of the plurality of timestamps; generating a second curve based on the determined plurality of DC resistance values with respect to the corresponding timestamp of the plurality of timestamps; determining a deviation value between the determined first curve and the generated second curve; and detecting the persistent short circuit in the battery, in response to the determined deviation value being greater than the threshold value.

The plurality of DC resistance values may correspond to a ratio of voltage and current applied to the battery at each timestamp of the plurality of timestamps; and the plurality of predefined DC resistance values may correspond to a ratio of voltage and current applied to the reference battery at each timestamp of the plurality of time stamps.

The battery may correspond to a rechargeable Lithium-ion (Li-ion) battery.

The method may include displaying an alert on a display of the battery-based device in response to the estimated short resistance being less than a threshold short resistance value.

In one or more general aspects, a non-transitory computer-readable storage medium may store instructions that, when executed by one or more processors, configure the one or more processors to perform any one, any combination, or all of operations and methods disclosed herein.

In one or more general aspects, a device includes: one or more processors; and memory storing instructions that, when executed by the one or more processors, cause the device to: monitor a plurality of direct current (DC) resistance values of the battery for a predefined time period during one of a constant power charging or discharging window of the battery; determine the plurality of DC resistance values of the battery at a plurality of timestamps corresponding to the predefined time period; determine a deviation of the determined plurality of DC resistance values by comparing the determined plurality of DC resistance values with a plurality of predefined DC resistance values associated with a reference battery; detect a persistent short circuit in the battery in response to the determined deviation of the determined plurality of DC resistance values being greater than a threshold value; and estimate, upon detecting the persistent short circuit in the battery, the short resistance of the battery based on a value of power supply in the constant power charging or discharging window and a magnitude of the determined deviation of the determined plurality of DC resistance values with respect to the plurality of predefined DC resistance values.

The instructions, when executed by the one or more processors, may cause the device to detect that the persistent short circuit is not present in the battery, in response to the determined deviation of the plurality of DC resistance values being less than the threshold value.

For the monitoring of the plurality of DC resistance values in the constant power charging or discharging window, the instructions, when executed by the one or more processors, may cause the device to initiate the monitoring from a preset cell voltage value for a preset duration.

The reference battery may correspond to a healthy battery with the plurality of predefined DC resistance values during the predefined constant power charging or discharging window.

For the estimating of the short resistance of the battery, the instructions, when executed by the one or more processors, may cause the device to determine, using an electrochemical-thermal model, the short resistance based on the value of power supply in the constant power and the magnitude of the determined deviation of the determined plurality of DC resistance values with respect to the plurality of predefined DC resistance values at predefined reference operating conditions For the detecting of the persistent short circuit in the battery, the instructions, when executed by the one or more processors, may cause the device to: determine a first curve based on the plurality of predefined DC resistance values with respect to the corresponding timestamp of the plurality of timestamps; generate a second curve based on the determined plurality of DC resistance values with respect to the corresponding timestamp of the plurality of timestamps; determine a deviation value between the determined first curve and the generated second curve; and detect the persistent short circuit in the battery, in response to the determined deviation value being greater than the threshold value.

The plurality of DC resistance values may correspond to a ratio of voltage and current applied to the battery at each timestamp of the plurality of timestamps; and the plurality of predefined DC resistance values may correspond to a ratio of voltage and current applied to the reference battery at each timestamp of the plurality of time stamps.

The battery may correspond to a rechargeable Lithium-ion (Li-ion) battery.

The instructions, when executed by the one or more processors, may cause the device to display an alert on a display of the battery-based device in response to the estimated short resistance being less than a threshold short resistance value.

In one or more general aspects, a processor-implemented method includes: determining a plurality of direct current (DC) resistance values of a battery at a plurality of timestamps corresponding to a predefined time period during one of a constant power charging or discharging window of the battery; determining a deviation of the determined plurality of DC resistance values by comparing the determined plurality of DC resistance values with a plurality of predefined DC resistance values associated with a reference battery; and detecting a persistent short circuit in the battery in response to the determined deviation of the determined plurality of DC resistance values being greater than a threshold value.

Other features and aspects will be apparent from the following detailed description, the drawings, and the claims.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
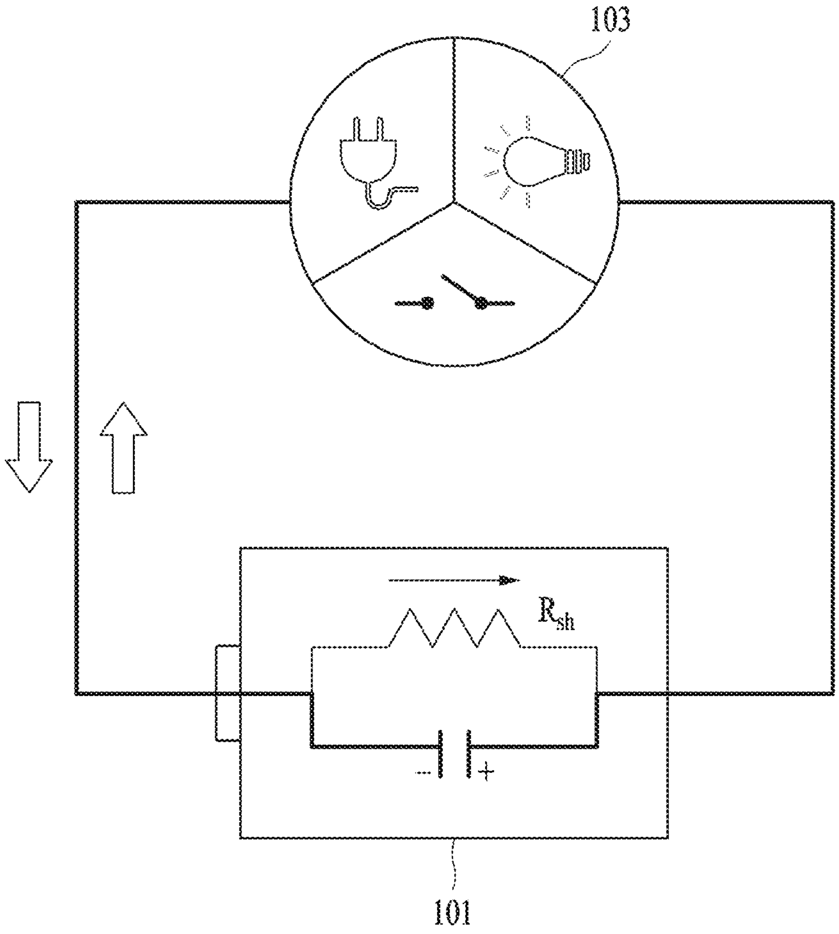
FIG. 1 illustrates an exemplary scenario of a battery having a short circuit.

The following detailed description is provided to assist the reader in gaining a comprehensive understanding of the methods, apparatuses, and/or systems described herein.

However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Throughout the specification, when a component or element is described as being "on", "connected to," "coupled to," or "joined to" another component, element, or layer it may be directly (e.g., in contact with the other component, element, or layer) "on", "connected to," "coupled to," or "joined to" the other component, element, or layer or there may reasonably be one or more other components, elements, layers intervening therebetween. When a component, element, or layer is described as being "directly on", "directly connected to," "directly coupled to," or "directly joined" to another component, element, or layer there can be no other components, elements, or layers intervening therebetween. Likewise, expressions, for example, "between" and "immediately between" and "adjacent to" and "immediately adjacent to" may also be construed as described in the foregoing.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

Unless otherwise defined, all terms, including technical and scientific terms, used herein have the same meaning as commonly understood by one of ordinary skill in the art to which this disclosure pertains and specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment (e.g., as to what an example or embodiment may include or implement) means that at least one example or embodiment exists where such a feature is included or implemented, while all examples are not limited thereto. The use of the terms "example" or "embodiment" herein have a same meaning (e.g., the phrasing "in one example" has a same meaning as "in one embodiment", and "one or more examples" has a same meaning as "in one or more embodiments").

Embodiments of the present disclosure will be described below in detail with reference to the accompanying drawings.

The terms "rechargeable battery" and "battery" may be used interchangeably throughout the description.

The term "electronic device", "device", and "battery-based device" may be used interchangeably throughout the description.

FIG. 1 illustrates an exemplary scenario of a battery having a short circuit.

An example diagram depicting a scenario with the unintentional electrical contact leading to the short circuit is shown in FIG. 1. In particular, FIG. 1 depicts an exemplary scenario of a battery having a short circuit. As can be seen in FIG. 1, a battery 101 may be charged by an external power source 103. Further, the short circuit may be unintentionally caused due to the electrical contact between the positive (+) terminal and the negative (−) terminal of the battery 101. In short circuit conditions, a resistance of the electrical contact between the positive terminal and the negative terminal of the battery 101 may be referred to as a short resistance $R_{sh}$. A higher value of $R_{sh}$ may permit a low amount of current to flow through the short circuit, whereas a lower value of $R_{sh}$ may permit a high amount of current to flow through the short circuit. Thus, for the lower value of $R_{sh}$, a large amount of thermal energy may be released because of the high amount of current flowing between the positive terminal and the negative terminal. Further, the short circuit may cause additional chain reactions, like electrolyte decomposition, and may result in a loss of active material. As a result, the temperature of the battery 101 may increase. Therefore, the short circuit may result in a rapid discharge of energy, causing excessive heat buildup and may potentially lead to damage, failure, or even fire in the rechargeable battery.

To overcome the damage or failure of the battery, when the short circuit is detected at an early stage, then the battery may be replaced to prevent the electronic device from a thermal run-away event. However, when the short circuit is detected at very later stages, then the thermal run-away event may occur, and the electronic device may get damaged due to the uncontrollable overheating of the battery. Furthermore, in the case of the occurrence of a thermal run-away event, the electronic device may shut down to isolate the battery from the electronic device.

Therefore, a method and device of one or more embodiments may detect the short circuit of the battery at an early stage to prevent any catastrophic damage to the electronic device.

Figure 2:
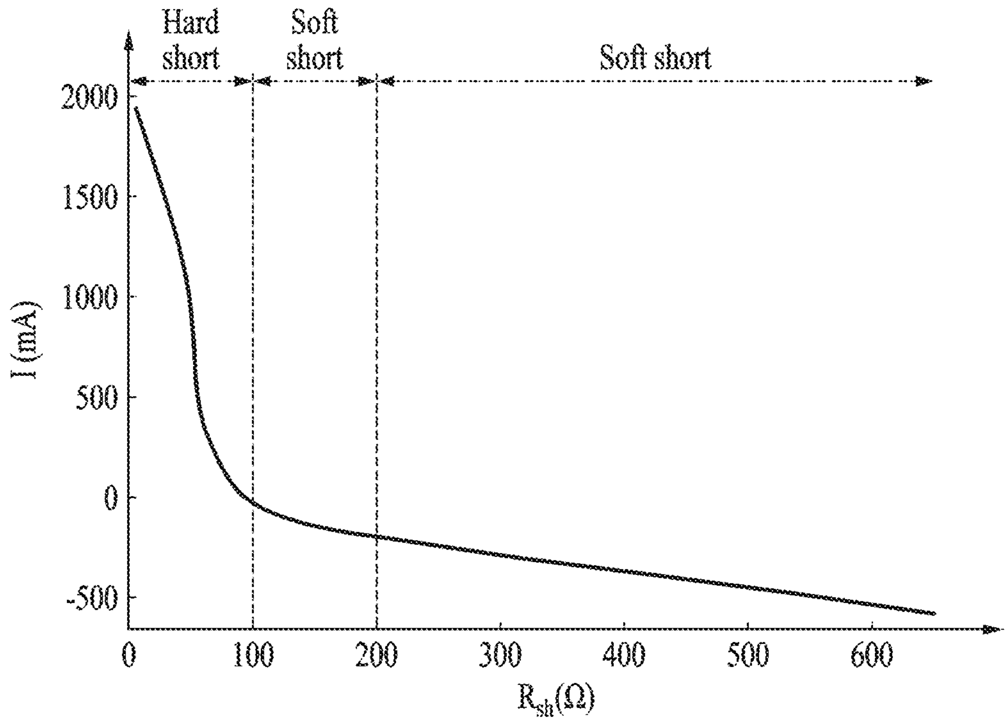
FIG. 2 illustrates an exemplary graphical representation depicting a variation of a current flow based on a short resistance.

FIG. 2 illustrates an exemplary graphical representation depicting a variation of a current flow based on a short resistance.

The short circuit at one stage relates to the higher value of $R_{sh}$, which may be referred to as a soft short. In contrast, at the later stages after the occurrence of the short circuit, the value of $R_{sh}$ decreases with time, which may be referred to as a hard short. Due to the decreasing amount of $R_{sh}$, high amounts of current flow through the battery. FIG. 2 illustrates an exemplary graphical representation depicting a variation of the current flow in a battery based on the short resistance. As can be seen in FIG. 2, the X-axis depicts the value of $R_{sh}$ between 1 ohm (Ω) to 600Ω, and the Y-axis depicts the variation of current flow based on the value of $R_{sh}$. Thus, according to FIG. 2, a low amount of current flows through the battery when the value of $R_{sh}$ is between 200Ω to 600Ω (i.e., in the soft short). In contrast, high amounts of current flow when the value of $R_{sh}$ is less than 100Ω (i.e., in the hard short). In a typical method and device, short circuit determination may be very challenging at the early life stages of the battery as signatures for determining the short circuit at this stage may be very weak. The persistent short circuit relates to the short circuit which is continuously present in the battery and is not intermittent.

Further, the typical method and device may only detect the persistent short circuit at later stages of short resistance (for example, 100Ω or less than 100Ω) with a maximum of 85% accuracy and are unable to detect any soft short.

Therefore, a method and device of one or more embodiments may overcome all the shortcomings and limitations of the above-discussed typical method and device.

Figure 3:
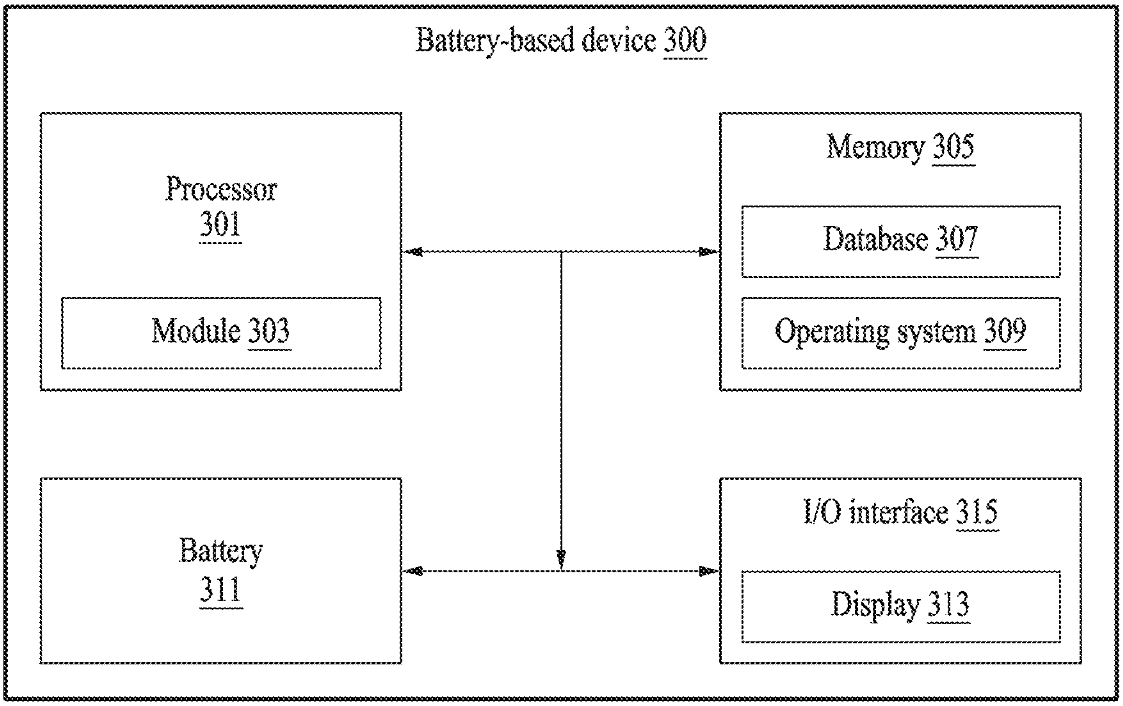
FIG. 3 illustrates a schematic block diagram of a battery-based device for estimating a short resistance of a battery, in accordance with one or more embodiments of the present disclosure.

FIG. 3 illustrates a schematic block diagram of a battery-based device for estimating a short resistance of a battery, in accordance with one or more embodiments of the present disclosure. A battery-based device 300 includes a processor 301 (e.g., one or more processors) which includes a module 303 (e.g., one or more modules), a memory 305 (e.g., one or more memories), a battery 311 (e.g., one or more batteries), and an input/output (I/O) interface 315. The memory 305 may include a database 307 and an operating system (OS) 309. Further, the I/O interface 315 may include a display 313. The processor 301, the memory 305, the battery 311, and the I/O interface 315 are communicatively coupled with each other. In a non-limiting example, the battery-based device 300 may correspond to a smartphone, a mobile, a tablet, a computer, a laptop, a car, a motorbike, a vacuum cleaner, and/or all electronic devices utilizing rechargeable batteries.

According to one or more embodiments, the processor 301 may be operatively coupled to the module 303 for processing, executing, or performing a set of operations. In one or more embodiments, the processor 301 may include at least one data processor for executing processes in a virtual storage area network (VSAN). The processor 301 may include specialized processing units such as integrated system (bus) controllers, memory management control units, floating point units, graphics processing units, digital signal processing units, etc. In one or more embodiments, the processor 301 may include a central processing unit (CPU), a graphics processing unit (GPU), or both. The processor 301 may be one or more general processors, digital signal processors, application-specific integrated circuits, field-programmable gate arrays, servers, networks, digital circuits, analog circuits, combinations thereof, and/or other now-known or later-developed devices for analyzing and processing data. The processor 301 may execute one or more instructions, such as code generated manually (i.e., programmed) to perform one or more operations disclosed herein throughout the disclosure.

According to one or more embodiments, the processor 301 includes the module 303 for performing specific operations. The term "module" or "modules" used herein may imply hardware (e.g., hardware implementing software and/or firmware). The "module" may be interchangeably used with a term such as logic, a logical block, a component, and the like. The "module" may be a minimum device component for performing one or more functions or may be a part thereof. The processor 301 may control the module 303 to execute a predetermined set of operations described in the disclosure.

According to one or more embodiments, the memory 305 may include any non-transitory computer-readable medium including, for example, volatile memory, such as static random-access memory (SRAM) and/or dynamic random-access memory (DRAM), and/or non-volatile memory, such as read-only memory (ROM), erasable programmable ROM, flash memory, hard disks, optical disks, and/or magnetic tapes. For example, the memory 305 may be or include a non-transitory computer-readable storage medium storing instructions that, when executed by the processor 301, configure the processor 301 or cause the battery-based device 300 to perform any one, any combination, or all of operations and methods disclosed herein with reference to FIGS. 1-10. The memory 305 is communicatively coupled with the processor 301 to store bitstreams or processing instructions for completing the process. Further, the memory 305 may include the OS 309 for performing one or more tasks of the battery-based device 300, as performed by a generic operating system in the communications domain or the standalone device. In one or more embodiments, the database 307 may be configured to store the information used by the module 305 and the processor 301 to perform one or more functions for estimating the short resistance of the battery 311 of the battery-based device 300, as discussed throughout the disclosure.

According to one or more embodiments, the battery 311 may correspond to a rechargeable battery. Alternatively, the battery-based device 300 may also include one or more batteries 311 to fulfill the electrical energy used by the battery-based device 300. The battery 311 may correspond to a rechargeable lithium-ion battery including one or more electrochemical cells. Each of the one or more electrochemical cells converts chemical energy into electrical energy through electrochemical reactions. During charging of the battery 311, the external power source 103 is connected to the battery 311 causing a flow of a plurality of electrons from a positive electrode (i.e., the positive terminal) to a negative electrode (i.e., the negative terminal) in the one or more electrochemical cells. Simultaneously, a plurality of ions migrates from the negative electrode to the positive electrode to complete the electrochemical reactions.

According to one or more embodiments, the display 313, also referred to as a display screen or a monitor, or a graphical user interface, may be an output device that visually presents information to a user. The display 313 may be an integral part of various electronic devices, including computers, smartphones, mobiles, user devices, tablets, televisions, cars, and more. The primary purpose of the display 313 may be to render visual content and provide the graphical user interface for interacting with the battery-based device 300. For the sake of brevity and to increase the succinctness of the specification, the display 313 is described in later sections of the specification in FIG. 10, wherein the display 313 relates to a display 1010 of FIG. 10.

According to one or more embodiments, the I/O interface 315 refers to one or more hardware components that enable data communication between the battery-based device 300 and any other devices or systems. The I/O interface 315 may serve as a communication medium for exchanging information, commands, or data with the other devices or systems. For the sake of brevity and to increase the succinctness of the specification, the I/O interface 315 is described in later sections of the specification in FIG. 10, wherein the I/O interface 315 relates to a communication interface 1014 of FIG. 10.

Figure 4:
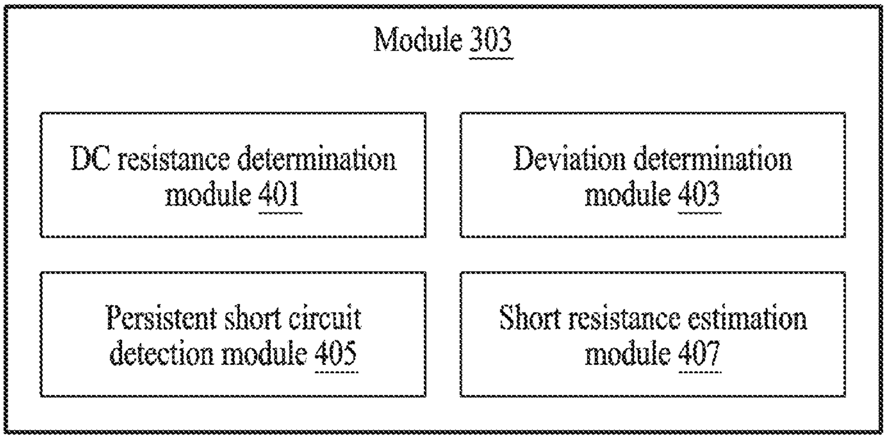
FIG. 4 illustrates a detailed block diagram of a module, in accordance with one or more embodiments of the present disclosure.

FIG. 4 illustrates a detailed block diagram of a module (e.g., the module 303 as illustrated in FIG. 3), in accordance with one or more embodiments of the present disclosure.

According to one or more embodiments, the processor 301 includes the module 303. The module 303 includes a direct current (DC) resistance determination module 401, a deviation determination module 403, a persistent short circuit detection module 405, and a short resistance estimation module 407. The module 303 may utilize data stored in the database 307 of the memory 305 for performing corresponding operations. The database 307 may store executable instructions and/or data generated when the module 303 executes one or more operations. Further, the database 307 may store predefined threshold values, one or more machine learning models, and variable values which may be used for the execution of the module 303.

The battery 311 may be determined as a healthy battery when the battery 311 is manufactured and used for the first time within the battery-based device 300. After certain usages of the battery 311, the health of the battery 311 may be automatically degraded based on the inherent characteristics of the one or more electrochemical cells of the battery 311. In a non-limiting example, a battery X of a mobile device corresponds to a healthy battery when the battery X is manufactured and used for the first time. After usage of the rechargeable battery, the health of the battery may be automatically degraded, and a persistent short circuit may occur due to an unintentional connection between the positive terminal and the negative terminal.

According to one or more embodiments, the DC resistance determination module 401 may be configured to monitor a plurality of DC resistance values of the battery 311 for a predefined time period during either one of a constant power charging or discharging window of the battery 311. To monitor the plurality of DC resistance values in the constant power charging or discharging window, the DC resistance determination module 401 may be configured to initiate the monitoring from a preset value of a cell voltage for a preset duration. In a non-limiting example, the DC resistance determination module 401 may be configured to initiate the monitoring when the cell voltage of the battery 311 is 60% (e.g., the preset value of the cell voltage). For example, the DC resistance determination module 401 may be configured to initiate the monitoring when the cell voltage of the battery increases to the preset value of the cell voltage (e.g., during charging of the battery 311) or decreases to less than or equal to the preset value of the cell voltage (e.g., during discharging of the battery 311). Particularly, the monitoring of the plurality of DC resistance values may be initiated when a charge of the battery 311 is 60%. Further, the DC resistance determination module 401 may be configured to monitor the plurality of DC resistance values of the battery 311 for a time period of 300 seconds during constant power of 10 Watts (W), 5 W, or 3 W at the time of either charging or discharging of the battery 311. Furthermore, the preset duration may correspond to a particular time period within a month or a year on which the monitoring may be initiated. For example, the DC resistance determination module 401 may be configured to initiate the monitoring during any of the $7^{th}$ to $10^{th}$ of every month at the time of charging of the battery 311.

Upon monitoring the plurality of DC resistance values of the battery 311, the DC resistance determination module 401 may be configured to determine the plurality of the DC resistance values of the battery 311 at a plurality of timestamps corresponding to the predefined time period. The plurality of DC resistance values may correspond to a ratio of voltage and current applied to the battery 311 at each timestamp of the plurality of timestamps. The DC resistance determination module 401 may be configured to determine the voltage and the current applied to the battery 311 and thereby determine the DC resistance by calculating (e.g., determining) the ratio of the voltage and the current in each timestamp of the plurality of timestamps. Therefore, the DC resistance may be determined by an expression mentioned in Equation 1 below, for example.

$$\text{DC resistance } (DCR) \text{ value} = V/I \quad \text{Equation 1}$$

In Equation 1, V is the voltage of the battery 311, and I is the current of the battery 311.

Figure 7A:
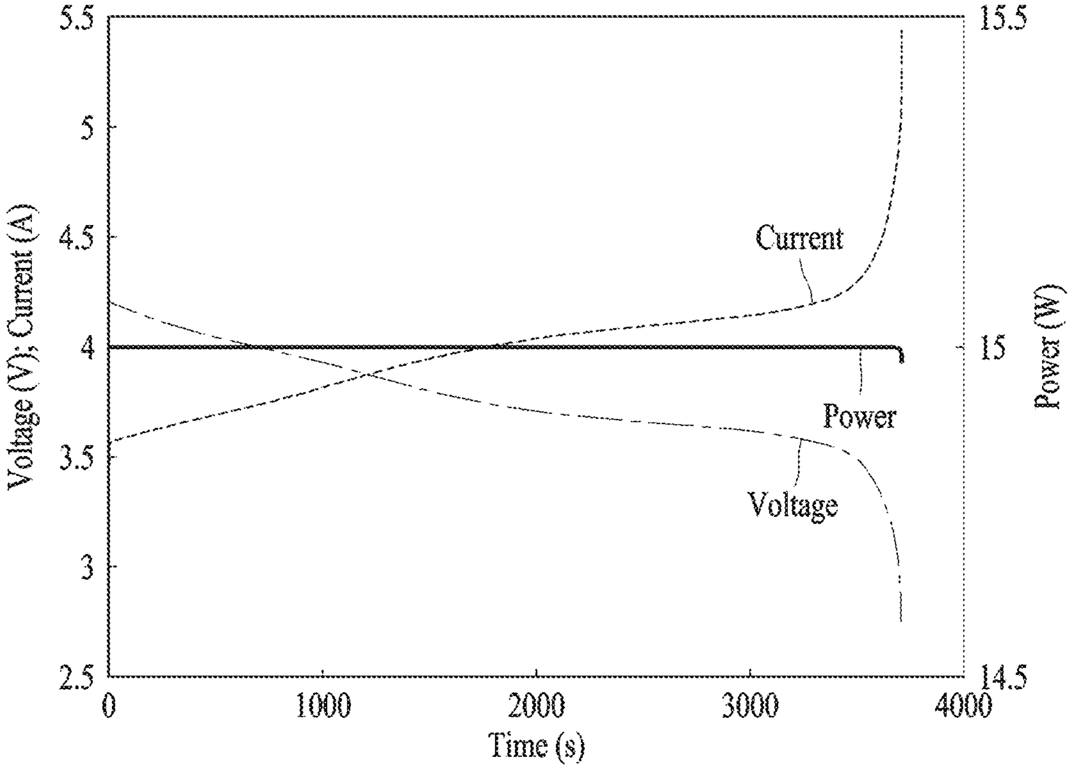
FIG. 7A illustrates a graphical representation depicting determining voltage and current in constant power within a time period, in accordance with one or more embodiments of the present disclosure.

FIG. 7A illustrates a graphical representation depicting determining voltage and current in constant power within a time period, in accordance with one or more embodiments of the present disclosure. FIG. 7A illustrates that in a constant power of 15 W (e.g., 15 W power charging the battery-based device 300 or the battery-based device 300 discharging power at 15 W), the values of current and voltage may be determined in each timestamp within the time period of 0 to 4000 seconds. Based on the determined current and voltage, the corresponding DC resistance values may be determined by calculating the ratio of the voltage and the current in each timestamp within the time period of 0 to 4000 seconds.

Figure 7B:
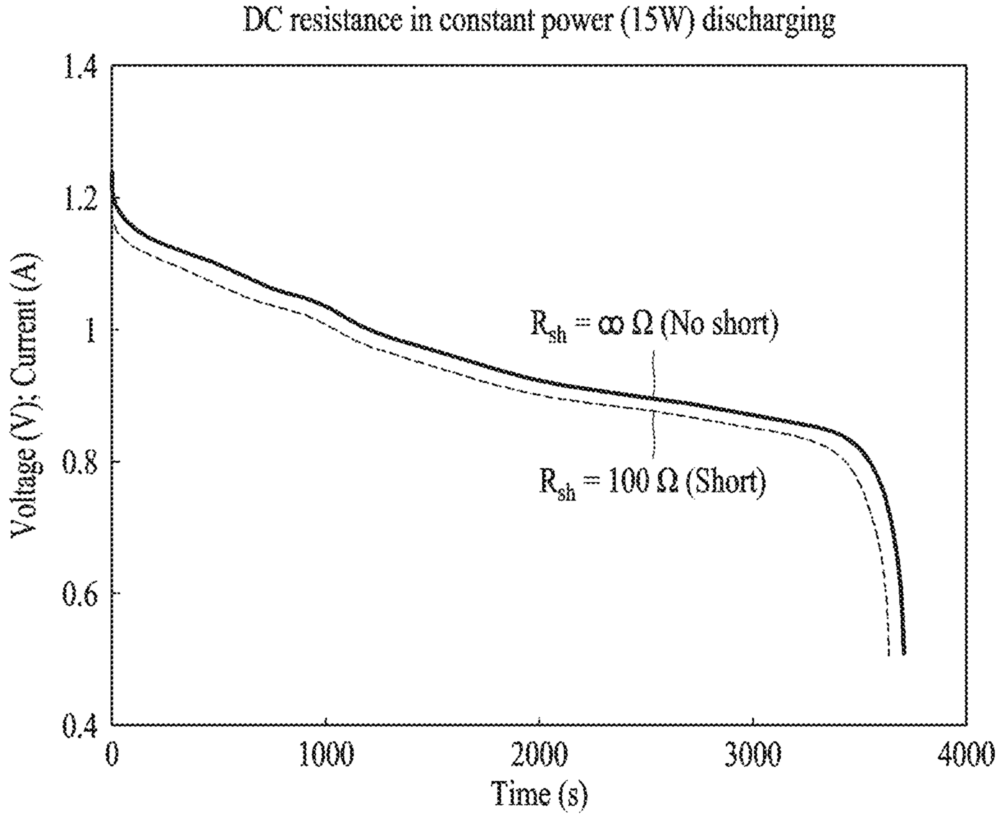
FIG. 7B illustrates a graphical representation depicting a plurality of curves of direct current (DC) resistance values with respect to a time period, in accordance with one or more embodiments of the present disclosure.

According to one or more embodiments, the deviation determination module 403 may be configured to determine a deviation in the determined plurality of DC resistance values by comparing the determined plurality of DC resistance values with a plurality of predefined or predetermined DC resistance values associated with a reference battery. The reference battery may correspond to a healthy battery. Further, the deviation determination module 403 may be configured to determine the plurality of predefined DC resistance values during a predefined constant power charging or discharging window for the healthy battery. Furthermore, the plurality of predefined DC resistance values may correspond to the ratio of voltage and current applied to the reference battery at each of the plurality of time stamps. FIG. 7B illustrates a graphical representation depicting a plurality of curves of the DC resistance values with respect to a time period, in accordance with one or more embodiments of the present disclosure. FIG. 7B illustrates a first curve of the DC resistance values determined based on the ratio of the voltage and the current when there is no short circuit (e.g., when $R_{sh}=\infty\Omega$). Therefore, the first curve relates to the representation of the predefined DC resistance values associated with the reference battery. FIG. 7B illustrates a second curve of the DC resistance values determined based on the ratio of the voltage and the current when there is a short circuit (e.g., when $R_{sh}=100\Omega$). Therefore, the second curve relates to the representation of the determined plurality of DC resistance values associated with the current state of the battery 311. The deviation is determined based on the distance between the first curve of the plurality of predefined DC resistance values of the reference battery and the second curve of the determined plurality of DC resistance values of the battery 311 (e.g., the distance between the first curve and the second curve for a same time stamp). In one or more embodiments, the deviation may be determined by considering the distance between an end value of the corresponding first curve and an end value of the corresponding second curve.

Figure 8A:
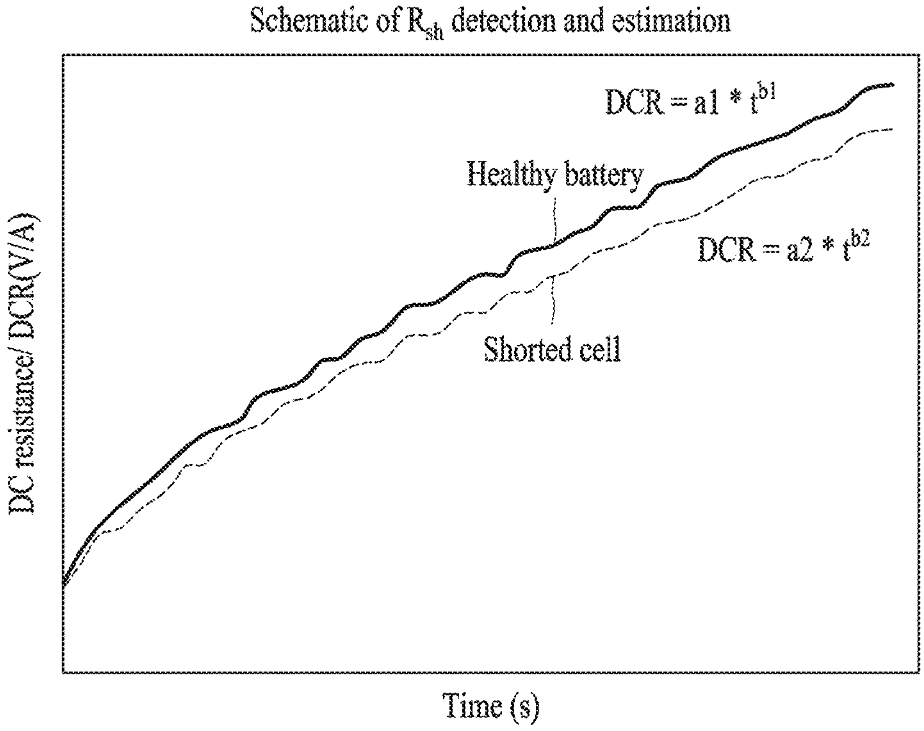
FIG. 8A illustrates a graphical representation depicting a plurality of DC resistance curves with respect to time to detect a persistent short circuit, in accordance with one or more embodiments of the present disclosure.

According to one or more embodiments, the persistent short circuit detection module 405 may be configured to detect a persistent short circuit in the battery 311 in response to the determined deviation of the plurality of DC resistance values being greater than a threshold value. To detect the persistent short circuit, the persistent short circuit detection module 405 may be configured to determine the first curve based on the plurality of predefined DC resistance values with respect to the corresponding timestamp of the plurality of timestamps. The first curve may be determined based on the plurality of predefined DC resistance values of the reference battery or healthy battery 311. Similarly, the persistent short circuit detection module 405 may be configured to generate the second curve based on the determined plurality of DC resistance values with respect to the corresponding timestamp of the plurality of timestamps. The second curve may be generated based on the determined plurality of DC resistance values of the battery 311 in the current state of the battery 311. Subsequently, the persistent short circuit detection module 405 may be configured to calculate the deviation value between the generated first curve and the determined second curve. The deviation may be calculated based on the difference in the distance between the generated first curve and the determined second curve. Further, the persistent short circuit detection module 405 may be configured to detect the persistent short circuit in the battery 311 in response to the calculated deviation value being greater than the threshold value. Alternatively, the persistent short circuit detection module 405 may be configured to detect that the persistent short circuit is not present in the battery 311, in response to the determined deviation of the plurality of DC resistance values being less than or equal to the threshold value. FIG. 8A illustrates a graphical representation depicting a plurality of DC resistance curves with respect to time to detect the persistent short circuit, in accordance with one or more embodiments of the present disclosure. In a non-limiting example, FIG. 8A illustrates that the first curve of the plurality of predefined DC resistance values is generated when the battery 311 is in a healthy state. Further, the second curve of the determined plurality of DC resistance values is generated when the battery 311 encounters the short circuit having the short resistance of 100Ω.

According to another embodiment, as illustrated in FIG. 8A, the first curve and the second curve may be formulated in an expression mentioned in Equation 2 below, for example, upon generating the curves based on plotting DC resistance values on the Y-axis corresponding to the time period on the X-axis.

$$\text{DC resistance } (DCR) \ Vs. \text{ Time period curve} = a_i * t^{bi} \qquad \text{Equation 2}$$

In equation 2, "a" corresponds to a predetermined variable, t corresponds to the timestamp period starting at the constant power condition, "b" corresponds to a variable determined based on a constant power charging/discharging value and the temperature of the battery, and "i" corresponds to the number of curves generated for the battery 311.

In a non-limiting example, the value of a1 (where a1 corresponds to the value associated with the first curve) may be the value of the voltage at which the constant power protocol is triggered. For example, when a1 is 3.5V, the constant power protocol is triggered. Further, when a1 is 3.5V, then b1 is 0.35 for a healthy cell.

The deviation between the first curve and the second curve may be proportional to the difference between the values of b1 and b2 (where b1 corresponds to the value calculated for the first curve, and b2 corresponds to the value calculated for the second curve). The deviation may be calculated based on an expression mentioned in Equation 3 below, for example.

$$\text{Deviation} = (b2 - b1)/b1 \qquad \text{Equation 3}$$

In a non-limiting example, the threshold value may be considered as 2% while detecting the persistent short circuit of the battery 311. Particularly, when the deviation value calculated based on Equation 2 is greater than 2%, then the persistent short circuit detection module 405 may be configured to detect that the battery 311 encounters the soft short. Alternatively, when the deviation value calculated based on Equation 2 is less than or equal to 2%, then no short circuit is present in the battery 311 (e.g., the persistent short circuit detection module 405 may be configured to determine that no short circuit is present in the battery 311). In a non-limiting example, the deviation calculated based on Equation 3 may be approximately 15% for $R_{sh}=50\Omega$ at a constant power of 3 W charging.

Figure 8B:
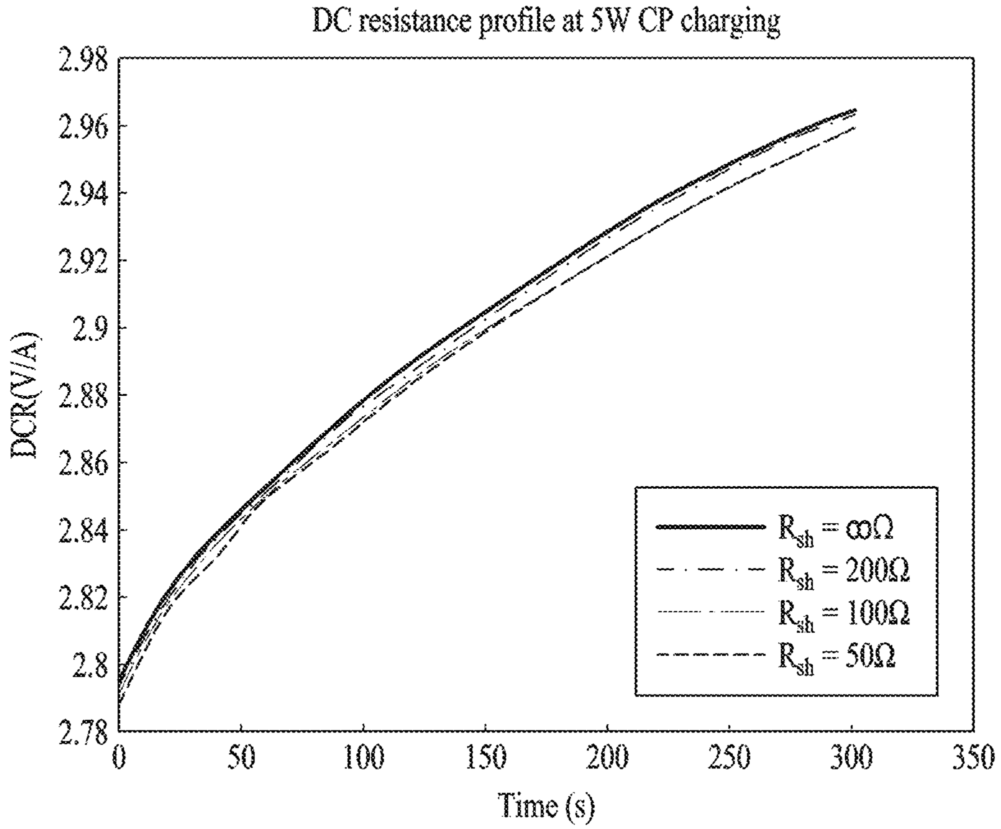
FIG. 8B illustrates a graphical representation depicting a plurality of DC resistance curves with respect to time in constant power of a 5-watt (5 W) charging or discharging window, in accordance with one or more embodiments of the present disclosure.

FIG. 8B illustrates a graphical representation depicting a plurality of DC resistance curves with respect to time in constant power of a 5 W charging or discharging window, in accordance with one or more embodiments of the present disclosure. FIG. 8B illustrates DC resistance values with respect to a time window of 350 seconds in constant power of the 5 W charging or discharging window at various short resistance values, such as at no short, 200Ω, 100Ω, and 50Ω.

Figure 8C:
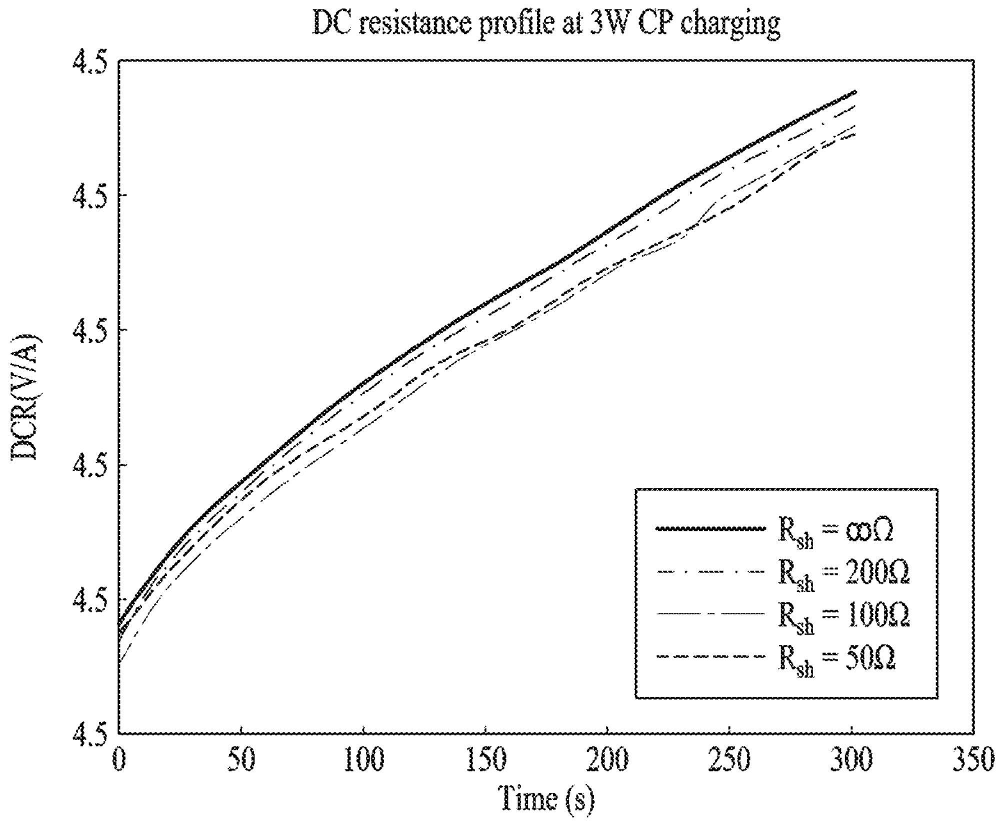
FIG. 8C illustrates a graphical representation depicting a plurality of DC resistance curves with respect to time in constant power of a 3 W charging or discharging window, in accordance with one or more embodiments of the present disclosure.

FIG. 8C illustrates a graphical representation depicting a plurality of DC resistance curves with respect to time in constant power of a 3 W charging or discharging window, in accordance with one or more embodiments of the present disclosure. FIG. 8C illustrates DC resistance values with respect to a time window of 350 seconds in constant power of the 3 W charging or discharging window at various short resistance values, such as at no short, 200Ω, 100Ω, and 50Ω.

As shown in FIG. 8C, the distinction between a shorted and a non-shorted cell is clearer at lower values of constant power. That is, the distinction is more clearly shown in the constant power of 3 W (as shown in FIG. 8C) rather than in the constant power of 5 W (as shown in FIG. 8B). The distinction is more clearly shown in lower constant power when the current flows through the short circuit in a lower value of constant power. That is to say, the distinction between the graphs of the shorted cell and the non-shorted cell may be more clearly visible in lower constant power in comparison to a case where the same amount of current flows through the short circuit for a higher value of constant power. Thus, the method and device of one or more embodiments may use lower values of constant power for a better resolution of data toward short-circuit detection and estimation. Also, a longer duration of the constant power charging window provides better detection and estimation of short circuits and persistent short resistance, respectively.

According to one or more embodiments, the short resistance estimation module 407 may be configured to estimate the short resistance of the battery 311. The short resistance of the battery 311 may be estimated based on the value of power supply in the constant power charging or discharging window and the magnitude of deviation. The magnitude of deviation may be determined based on the determined plurality of DC resistance values of the battery 311 in the current state of the battery 311 with respect to the plurality of predefined DC resistance values of the battery 311 in the healthy state. The short resistance estimation module 407 may be configured to calculate the short resistance using an electrochemical-thermal model. Further, the electrochemical-thermal model may be configured to calculate the short resistance utilizing the value of power supply in the constant power and the magnitude of deviation. The magnitude of deviation may be determined at predefined reference operating conditions based on the determined plurality of DC resistance values with respect to the plurality of predefined DC resistance values. The predetermined reference operating conditions may remain the same during the determination of the plurality of DC resistance values and the determination of the plurality of predefined DC resistance values. The reference operating conditions may correspond to one or more conditional parameters such as, but not exclusively limited to, the temperature, constant power, a charging or discharging window, a battery level at which the charging or discharging is initiated, and/or etc.

According to one or more embodiments, the electrochemical-thermal model may be configured to estimate the short resistance based on Equations 4 to 11 below, for example.

In a constant power (CP)-based charging/discharging, the voltage V and current I may follow an expression mentioned in Equation 4 below, for example, without having any short circuit in the battery 311.

$$\text{Voltage} * \text{Current} = V * I = K \qquad \text{Equation 4}$$

In Equation 4, K is the constant power used during charging/discharging of the battery 311. For example, K may correspond to 3 W, 5 W, or 10 W, etc.

In the presence of a short circuit, a leakage current, or a short current, $I_{sh}$ may be equal to an expression mentioned in Equation 5 below, for example.

$$I_{sh} = V / R_{sh} \quad \text{Equation 5}$$

In Equation 5, $R_{sh}$ is the short resistance.

But, to maintain the CP and sustain the short-linked leakage current, the voltage of the battery 311 may accordingly adjust to the value in accordance with an expression mentioned in Equation 6 below, for example.

$$V_{new} = K / I_{new} \quad \text{Equation 6}$$

In Equation 6, $V_{new}$ is the new battery voltage, and $I_{new}$ is the new battery current.

Thus, the new battery current $I_{new}$ may correspond to an expression mentioned in Equation 7 below, for example.

$$I_{new} = I - I_{sh} = I - \frac{V}{R_{sh}} \quad \text{Equation 7}$$

The DC resistance (DCR) is calculated based on expressions mentioned in Equations 8 and 9 below, for example.

$$DCR = \Delta(V / I) = f(R_{sh}) \quad \text{Equation 8}$$

$$DCR = \frac{dV}{dI}; \text{(using Equation 1)} = \frac{K}{I^2} \quad \text{Equation 9}$$

Given V*I=K during the constant power-based charging/discharging.

Therefore, in the presence of a short circuit, $I_{new}$ corresponds to the expression mentioned in Equation 7. Thus, utilizing Equation 7 into Equation 9, the DCR value may correspond to expressions mentioned in Equations 10 and 11 below, for example.

$$DCR = \frac{dV}{dI} = \frac{K}{\left(I - \frac{V}{R_{sh}}\right)^2} = \frac{KR_{sh}^2}{(IR_{sh} - V)^2} \quad \text{Equation 10}$$

Therefore, Equation 11 below, for example, may be satisfied.

$$DCR \propto R_{sh}^b \quad \text{Equation 11}$$

$I_{new}$ is the new battery current, I is the total current, and $I_{sh}$ is the short current.

Therefore, the short resistance $R_{sh}$ may be estimated by Equation 10. Further, the DCR is proportional to the value of the short resistance $R_{sh}$ to the power of the value of variable b, where b corresponds to the variable as mentioned in Equation 2. Thus, the short resistance estimation module 407 may be configured to calculate the short resistance $R_{sh}$ utilizing the value of power supply in the constant power K and the magnitude of deviation (utilizing the variable b) between the first curve and the second curve in similar operating conditions.

According to one or more embodiments, upon estimating the short resistance of the battery 311, the short resistance estimation module 407 may be configured to display an alert on the display 313 of the battery-based device 300 when the estimated short resistance is less than a threshold short resistance value. By displaying the alert on the display 313, the user of the battery-based device 300 is notified in advance that the battery 311 has some problems. In this case, the battery 311 should be checked at any service center. In a non-limiting example, in the range of short resistance of 0Ω to 2000Ω, the soft short may correspond to a value of 200Ω to 2000Ω. In this embodiment, the threshold short resistance value may be set as 250Ω. Thus, when the estimated short resistance value (for example, 200Ω) is less than the threshold short resistance value (i.e., 250Ω), then the alert is displayed on the display 313.

Figure 5:
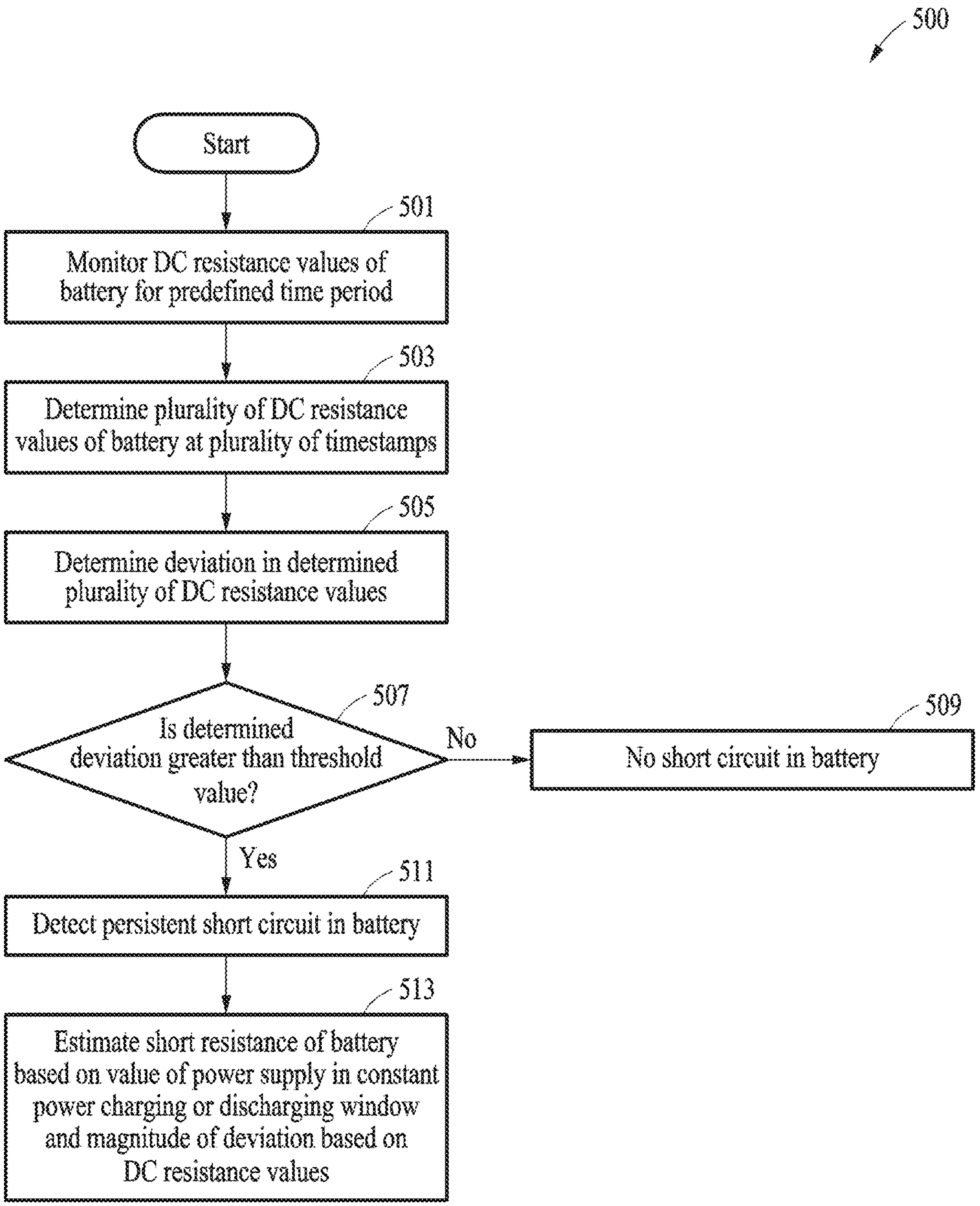
FIG. 5 illustrates a flowchart of a method of estimating a short resistance of a battery of a battery-based device, in accordance with one or more embodiments of the present disclosure.

FIG. 5 illustrates a flowchart of a method of estimating a short resistance of a battery of a battery-based device, in accordance with one or more embodiments of the present disclosure. FIG. 5 illustrates a method 500 of estimating a short resistance of the battery 311. The method 500 initializes execution from the start block of FIG. 5. While the operations of FIG. 5 may be performed in the shown order and manner, the order of one or more of the operations may be changed, one or more of the operations may be omitted, and/or one or more of the operations may be performed in parallel or simultaneously, without departing from the spirit and scope of the shown examples.

In operation 501, the method 500 includes monitoring a plurality of DC resistance values of the battery 311 for a predefined time period during one of a constant power charging or discharging window of the battery 311. The DC resistance determination module 401 may be configured to monitor the plurality of DC resistance values of the battery 311. Further, the DC resistance determination module 401 may be configured to initiate the monitoring from the preset value of the cell voltage for the preset duration.

In operation 503, the method 500 includes determining the plurality of the DC resistance values of the battery 311 at a plurality of timestamps corresponding to the predefined time period. Based on the monitoring of the plurality of DC resistance values, the DC resistance determination module 401 may be configured to determine the plurality of the DC resistance values of the battery 311. The plurality of DC resistance values may correspond to the ratio of the voltage and the current applied to the battery 311 at each timestamp of the plurality of timestamps.

In operation 505, the method 500 includes determining a deviation in the determined plurality of DC resistance values by comparing the determined plurality of DC resistance values with a plurality of predefined DC resistance values associated with a reference battery. The deviation determination module 403 may be configured to determine the deviation between the determined plurality of DC resistance values of the battery 311 in the current state of the battery 311 and the plurality of predefined DC resistance values associated with the reference battery. The reference battery corresponds to a healthy battery. Particularly, the plurality of predefined DC resistance values may be depicted in a graphical representation to define a first graph, for example, with respect to the time period. Similarly, the determined plurality of DC resistance values of the battery 311 may be depicted in a second graph, for example, with respect to the time period.

In operation 507, the method 500 includes determining whether the determined deviation is greater than a threshold value. In response to the determined deviation of the plurality of DC resistance values being greater than the threshold value, the flow of the method 500 proceeds to operation 511. Alternatively, in response to the determined deviation of the plurality of DC resistance values being less than equal to the threshold value, the flow of the method 500 proceeds to operation 509.

In operation 511, the method 500 includes detecting a persistent short circuit in the battery 311 in response to the determined deviation of the plurality of DC resistance values being greater than the threshold value. The persistent short circuit detection module 405 may be configured to detect the persistent short circuit in the battery 311 in response to the determined deviation being greater than the threshold value. Therefore, in operation 511, the persistent short circuit detection module 405 may detect whether the persistent short circuit persists in the battery 311.

In operation 509, the method 500 includes detecting that a persistent short circuit is not present in the battery 311 in response to the determined deviation of the plurality of DC resistance values being less than equal to the threshold value. When the persistent short circuit detection module 405 detects that no persistent short circuit is present in the battery 311, the method 500 stops here.

In operation 513, the method 500 includes estimating a short resistance of the battery 311 in response to the persistent short circuit persisting in the battery 311 as determined in operation 511. The short resistance estimation module 407 may be configured to estimate the short resistance based on the value of power supply in the constant power charging or discharging window and the magnitude of deviation. The magnitude of deviation may be determined based on the determined plurality of DC resistance values with respect to the plurality of predefined DC resistance values. The short resistance estimation module 407 may be configured to calculate the short resistance using an electrochemical-thermal model. The electrochemical-thermal model may be configured to calculate the short resistance based on the value of power supply in the constant power and the magnitude of deviation at predefined reference operating conditions. Upon estimating the short resistance value, the short resistance estimation module 407 may be configured to display the alert on the display 313 of the battery-based device 300 in response to the estimated short resistance being less than the threshold short resistance value. According to another embodiment, the short resistance estimation module 407 may also be configured to display the estimated short resistance value on the display 313 of the battery-based device 300. Upon displaying the alert or the estimated short resistance value, the user may be notified that the battery 311 should be checked in a service center for replacement. Thus, the method 500 of one or more embodiments includes estimating the soft short resistance of the battery 311 efficiently and thereby displaying the alert or the short resistance value to notify the user. In a non-limiting example, the threshold short resistance value for estimating the short resistance or soft short resistance may be determined by the value of C/3.7Ω, where C is the capacity of the battery and may be measured by Ampere-hours (Ah). In other words, in the case of a soft short, the maximum value of self-discharge current (leakage current) may be determined by the value of C/3.7Ω. Further, when the self-discharge current reaches 274 C, then a thermal runway condition may occur for the battery. Thus, to estimate the short resistance for displaying an alert to the user, the threshold short resistance value may be considered as 10 times of C/3.7Ω, which is approximately 3 CΩ. For example, a battery PQR may have a capacity of 4000 milli-Ampere-hours (mAh) (which equals to 4 Ah). Thus, the threshold short resistance value for the battery PQR may be considered as 3*4Ω, i.e., 12Ω. Therefore, in response to the estimated short resistance value being less than 12Ω, the alert may be displayed to the user that the battery PQR should be checked in a service center.

Operations 501 through 513 and other operations of the method 500 disclosed herein may be performed by the processor 301 of the battery-based device 300.

Figure 6:
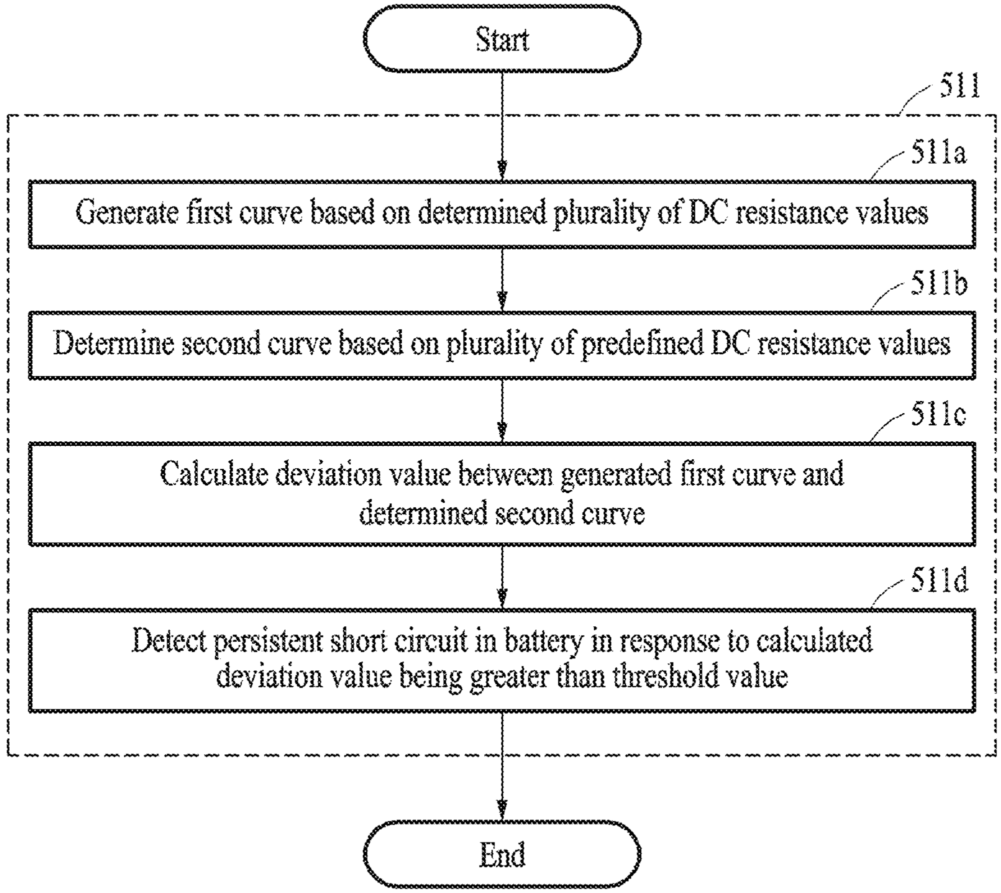
FIG. 6 illustrates a flowchart of subsequent operations of detecting a persistent short circuit in a battery, in accordance with one or more embodiments of the present disclosure.

FIG. 6 illustrates a flowchart of subsequent operations of detecting the persistent short circuit in a battery (e.g., the battery as disclosed in operation 511 of FIG. 5), in accordance with one or more embodiments of the present disclosure. While the operations of FIG. 6 may be performed in the shown order and manner, the order of one or more of the operations may be changed, one or more of the operations may be omitted, and/or one or more of the operations may be performed in parallel or simultaneously, without departing from the spirit and scope of the shown examples.

FIG. 6 discloses detailed operations for detecting the persistent short circuit in the battery 311.

In operation 511*a*, a method 511 includes determining a first curve based on the plurality of predefined DC resistance values with respect to the corresponding timestamp of the plurality of timestamps. The persistent short circuit detection module 405 may be configured to determine the first curve based on the plurality of predefined DC resistance values for the reference battery. The reference battery corresponds to a healthy battery. The first curve may be determined or plotted based on the predefined DC resistance values on the Y-axis with respect to the corresponding timestamp of the plurality of timestamps on the X-axis of a two-dimensional graph. An example may be found in FIG. 7B of the present disclosure. In accordance with FIG. 7B, the first graph may correspond to the graph when $R_{sh}$ is equal to ∞ Ω (i.e. when no short circuit is present at the healthy state of the battery 311).

In operation 511*b*, the method 511 includes generating a second curve based on the determined plurality of DC resistance values with respect to the corresponding timestamp of the plurality of timestamps. The persistent short circuit detection module 405 may be configured to generate the second curve in the current state of the battery 311. The second curve may be determined or plotted based on the determined plurality of DC resistance values on the Y-axis with respect to the corresponding timestamp of the plurality of timestamps on the X-axis of the two-dimensional graph. An example may be found in FIG. 7B of the present disclosure. In accordance with FIG. 7B, the second graph may correspond to the graph when $R_{sh}$ is equal to 100Ω (i.e. when the persistent short circuit is present in the current state of the battery 311).

In operation 511*c*, the method 511 includes calculating the deviation value between the determined first curve and the generated second curve. The persistent short circuit detection module 405 may be configured to calculate the deviation. The deviation between the first curve and the second curve may be calculated based on Equations 2 and 3 of the present disclosure.

In operation 511*d*, the method 511 includes detecting a persistent short circuit in the battery 311 in response to the calculated deviation value being greater than the threshold value. The persistent short circuit detection module 405 may be configured to detect the persistent short circuit in response to the calculated deviation being greater than the threshold value. In a non-limiting example, the deviation between the first graph and the second graph may be calculated as 4%, and the threshold value may be 2%.

Therefore, the short circuit is detected in the battery 311. By varying the threshold value, the method of one or more embodiments may easily determine a soft short of the battery 311, and may estimate the short resistance to alert the user. In a non-limiting example, the threshold value may be determined based on various experimental results or by an automatic threshold determination module using a machine learning (ML) model.

Figure 9:
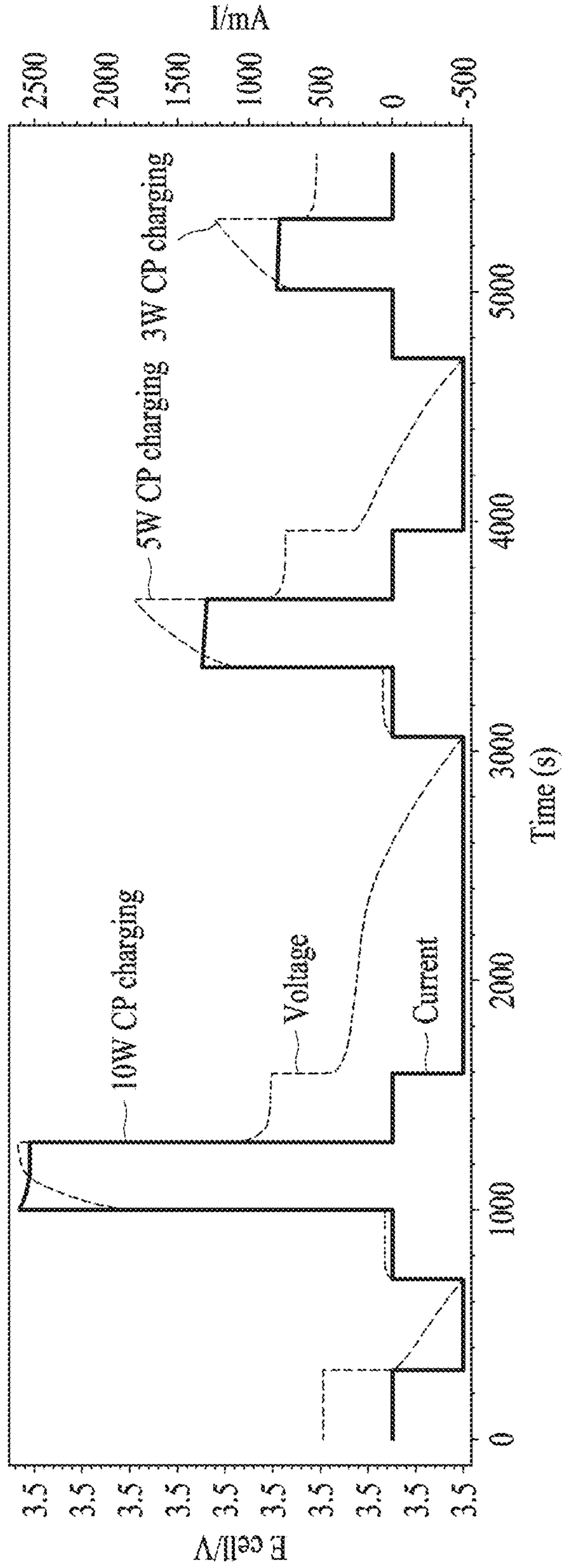
FIG. 9 illustrates a graphical representation depicting voltage and current values in various constant power charging windows, in accordance with one or more embodiments of the present disclosure.

FIG. 9 illustrates a graphical representation depicting voltage and current values in various constant power (CP) charging windows, in accordance with one or more embodiments of the present disclosure. FIG. 9 depicts a time period (in seconds) along the X-axis, voltage (V) labels along a primary Y-axis, and current (I) labels along a secondary Y-axis. FIG. 9 illustrates variations of the voltage and current in a plurality of constant powers (W) charging with the short resistance value ranging from 50Ω to 200Ω. The constant powers correspond to 10 W, 5 W, and 3 W. Further, the constant power is applied for a time period of 300 seconds. For example, the battery 311 may include a short resistance of 200Ω. The variation of both the voltage and current is shown in FIG. 9 depicting the constant power of 10 W applied from approximately 1000 seconds to 1300 seconds. Further, FIG. 9 depicts that the constant power of 5 W is applied from approximately 3300 seconds to 3600 seconds. Similarly, FIG. 9 depicts that the constant power of 3 W is applied from approximately 5000 seconds to 5300 seconds. The rest of the time along the X-axis, the battery 311 is charged in normal power supply conditions, i.e., by a constant voltage and/or by constant current charging conditions.

Reference is now made to the technical abilities and effectiveness of the methods and the battery-based device 300 disclosed herein. The present disclosure provides the technical advantages of effectively detecting the soft short of the battery 311. Further, upon detecting the soft short or soft short circuit in the battery 311, the present disclosure effectively estimates the short resistance of the battery 311. The changes in the DC resistance values during the constant power charging phase are specific to the short circuit-linked leakage current. The present disclosure estimates a very soft short (for example, 200Ω or above) with 90% accuracy utilizing only 5 min of constant power charging or discharging. Further, the present disclosure does not need to change/modify the existing charging protocol/hardware.

Figure 10:
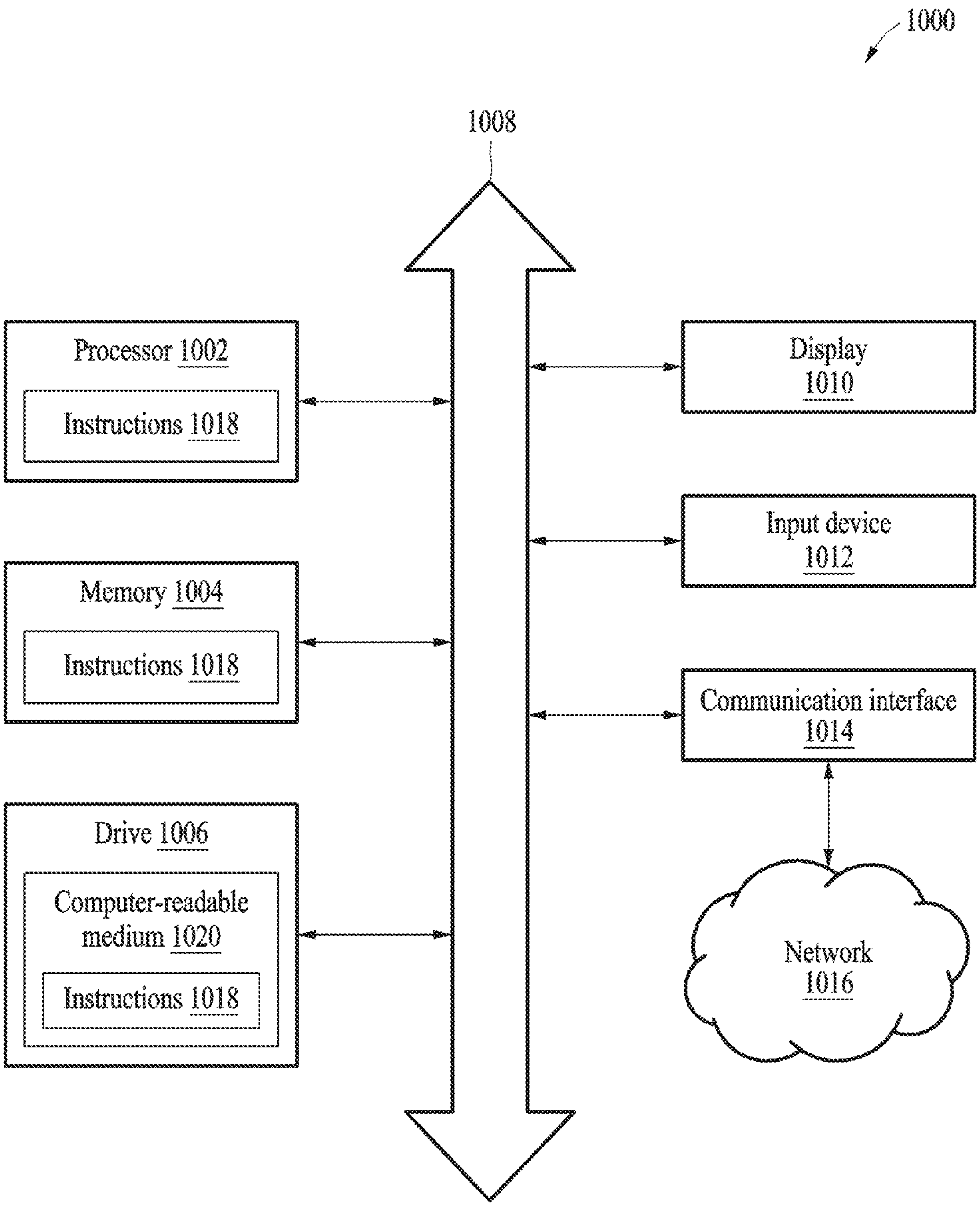
FIG. 10 illustrates an exemplary implementation of a hardware configuration of a battery-based device in the form of a computer system, in accordance with one or more embodiments of the present disclosure.

Referring now to FIG. 10, an exemplary implementation ofa typical hardware configuration of the battery-based device 300 in the form of a computer system 1000, in accordance with one or more embodiments of the present disclosure, is illustrated. The computer system 1000 may include a set of instructions that can be executed to cause the computer system 1000 to perform any one or more of the methods disclosed. The computer system 1000 may operate as a standalone device or may be connected, for example, using a network, to other computer systems or peripheral devices.

In a networked deployment, the computer system 1000 may operate in the capacity of a server or as a client-user computer in a server-client user network environment, or as a peer computer system in a peer-to-peer (or distributed) network environment. The computer system 1000 may also be implemented as or incorporated across various devices, such as a personal computer (PC), a tablet PC, a personal digital assistant (PDA), a mobile device, a palmtop computer, a laptop computer, a desktop computer, a communication device, a wireless telephone, a land-line telephone, a web appliance, a network router, a switch or bridge, or any other machine capable of executing a set of instructions (sequential or otherwise) that specify actions to be taken by that machine. Further, while a single computer system 700 is illustrated, the term "system" shall also be taken to include any collection of systems or sub-systems that individually or jointly execute a set, or multiple sets, of instructions to perform one or more computer functions.

The computer system 1000 may include a processor 1002 (e.g., one or more processors), for example, a central processing unit (CPU), a graphics processing unit (GPU), or both. The processor 1002 may correspond to the processor 301 of the battery-based device 300. The processor 1002 may be a component in a variety of systems. As one or more embodiments, the processor 1002 may be part of a standard personal computer or a workstation. The processor 1002 may be one or more general processors, digital signal processors, application-specific integrated circuits, field-programmable gate arrays, servers, networks, digital circuits, analog circuits, combinations thereof, or other now-known or later-developed devices for analyzing and processing data. The processor 1002 may implement a software program, such as code generated manually (i.e., programmed).

The computer system 1000 may include a memory 1004 (e.g., one or more memories), such as a memory that may communicate via a bus 1008. The memory 1004 may correspond to the memory 305 of the battery-based device 300. The memory 1004 may include, but is not limited to, computer-readable storage media such as various types of volatile and non-volatile storage media, including, but not limited to, random-access memory, read-only memory, programmable read-only memory, electrically programmable read-only memory, electrically erasable read-only memory, flash memory, magnetic tapes or disks, optical media, and the like. In an example, the memory 1004 includes a cache or random-access memory for the processor 1002. In alternative examples, the memory 1004 is separate from the processor 1002, such as a cache memory of a processor, a system memory, or other memory. The memory 1004 may be an external storage device or database for storing data. The memory 1004 is operable to store instructions executable by the processor 1002. For example, the memory 1004 may be or include a non-transitory computer-readable storage medium storing instructions that, when executed by the processor 1002, configure the processor 1002 to perform any one, any combination, or all of the operations and methods disclosed herein with reference to FIGS. 1-10. The functions, acts, or tasks illustrated in the drawings or described may be performed by the processor 1002 programmed for executing the instructions stored in the memory 1004. The functions, acts, or tasks are independent of a particular type of instruction set, storage media, processor, or processing strategies and may be performed by hardware (e.g., hardware implementing software, firmware, and/or micro-code), integrated circuits, and the like, operating alone or in combination. Likewise, the processing strategies may include multiprocessing, multitasking, parallel processing, and the like.

As shown, the computer system 1000 may or may not further include the display 1010, such as a liquid crystal display (LCD), an organic light-emitting diode (OLED), a flat panel display, a solid-state display, a projector, a printer or other now-known or later-developed display device for outputting determined information. The display 1010 may act as an interface for a user to see the functioning of the processor 1002, or specifically as an interface with the software stored in the memory 1004 or a drive 1006.

Additionally, the computer system 1000 may include an input device 1012 configured to allow the user to interact with any of the components of the computer system 1000. The computer system 1000 may also include a disk or drive 1006 (for example, an optical drive unit). The disk drive 1006 may include a computer-readable medium 1020 in which one or more sets of instructions 1018, for example, software, may be embedded. Further, the instructions 1018 may embody one or more of the methods or logic as described. In a particular example, the instructions 1018 may reside completely, or at least partially, within the memory 1004 or the processor 1002 during execution by the computer system 1000.

The present disclosure contemplates a computer-readable medium that includes the instructions 1018 or receives and executes the instructions 1018 responsive to a propagated signal so that a device connected to a network 1016 may communicate voice, video, audio, and images or any other data over the network 1016. Further, the instructions 1018 may be transmitted or received over the network 1016 via a communication interface (e.g., a communication port) 1014 or using the bus 1008. The communication interface 1014 may be part of the processor 1002 or may be a separate component. The communication interface 1014 may be a physical connection in hardware. The communication interface 1014 may be configured to connect with the network 1016, external media, the display 1010, or any other components in the computer system 1000, or combinations thereof. The connection with the network 1016 may be a physical connection, such as a wired Ethernet connection, or may be established wirelessly as discussed later. Likewise, the additional connections with other components of the computer system 1000 may be physical or may be established wirelessly. The network 1016 may alternatively be directly connected to the bus 1008.

The network 1016 may include a wired network, a wireless network, an Ethernet Audio video bridging (AVB) network, or a combination thereof. The wireless network may be a cellular telephone network, or an 802.11, 802.16, 802.20, 802.1Q, or WiMax network. Further, the network 1016 may be a public network such as the Internet, a private network such as an intranet, or a combination thereof, and may utilize a variety of networking protocols now available or later developed including, but not limited to, Transmission Control Protocol (TCP)/Internet Protocol (IP)-based networking protocols. The communication system 1000 is not limited to operation with any particular standards and protocols. As one or more embodiments, standards for Internet and other packet-switched network transmissions (e.g., TCP/IP, User Datagram Protocol (UDP)/IP, HyperText Markup Language (HTML), and Hypertext Transfer Protocol (HTTP)) may be used.

The batteries, external power sources, battery-based devices, processors, modules, memories, I/O interfaces, displays, DC resistance determination modules, deviation determination modules, persistent short circuit detection modules, short resistance estimation modules, computer systems, drives, buses, input devices, communication interfaces, computer-readable mediums, battery 101, external power source 103, battery-based device 300, processor 301, module 303, memory 305, battery 311, I/O interface 315, display 313, DC resistance determination module 401, deviation determination module 403, persistent short circuit detection module 405, short resistance estimation module 407, computer system 1000, processor 1002, memory 1004, drive 1006, bus 1008, display 1010, input device 1012, communication interface 1014, computer-readable medium 1020, described herein, including descriptions with respect to respect to FIGS. 1-10, are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in, and discussed with respect to, FIGS. 1-10 that perform the operations described in this application are performed by computing hardware, for example, by one or more processors or computers, implemented as described above implementing instructions (e.g., computer or processor/processing device readable instructions) or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A processor-implemented method comprising:

monitoring a plurality of direct current (DC) resistance values of a battery for a predefined time period during one of a constant power charging or discharging window of the battery;

determining the plurality of DC resistance values of the battery, each of the plurality of DC resistance values corresponding to a respective timestamp of a plurality of timestamps corresponding to the predefined time period;

determining a deviation of the determined plurality of DC resistance values by comparing the determined plurality of DC resistance values with a plurality of predefined DC resistance values associated with a reference battery;

detecting a persistent short circuit in the battery in response to the determined deviation of the determined plurality of DC resistance values being greater than a threshold value; and estimating, in response to detecting the persistent short circuit in the battery, a short resistance of the battery based on a value of power supply in the constant power charging or discharging window and a magnitude of the determined deviation of the determined plurality of DC resistance values with respect to the plurality of predefined DC resistance values.

2. The method of claim 1, further comprising detecting that the persistent short circuit is not present in the battery, in response to the determined deviation of the plurality of DC resistance values being less than the threshold value.

3. The method of claim 1, wherein the monitoring of the plurality of DC resistance values in the constant power charging or discharging window comprises initiating the monitoring from a preset cell voltage value for a preset duration.

4. The method of claim 1, wherein the reference battery corresponds to a healthy battery with the plurality of predefined DC resistance values during the predefined constant power charging or discharging window.

5. The method of claim 1, wherein the estimating of the short resistance of the battery comprises determining, using an electrochemical-thermal model, the short resistance based on the value of power supply in the constant power and the magnitude of the determined deviation of the determined plurality of DC resistance values with respect to the plurality of predefined DC resistance values at predefined reference operating conditions.

6. The method of claim 1, wherein the detecting of the persistent short circuit in the battery comprises:

determining a first curve based on the plurality of predefined DC resistance values with respect to the corresponding timestamp of the plurality of timestamps;

generating a second curve based on the determined plurality of DC resistance values with respect to the corresponding timestamp of the plurality of timestamps;

determining a deviation value between the determined first curve and the generated second curve; and detecting the persistent short circuit in the battery, in response to the determined deviation value being greater than the threshold value.

7. The method of claim 1, wherein the plurality of DC resistance values corresponds to a ratio of voltage and current applied to the battery at each timestamp of the plurality of timestamps; and the plurality of predefined DC resistance values corresponds to a ratio of voltage and current applied to the reference battery at each timestamp of the plurality of time stamps.

8. The method of claim 1, wherein the battery corresponds to a rechargeable Lithium-ion (Li-ion) battery.

9. The method of claim 1, further comprising displaying an alert on a display of the battery-based device in response to the estimated short resistance being less than a threshold short resistance value.

10. A non-transitory computer-readable storage medium storing instructions that, when executed by one or more processors, configure the one or more processors to perform the method of claim 1.

11. A device, comprising:

one or more processors; and memory storing instructions that, when executed by the one or more processors, cause the device to:

monitor a plurality of direct current (DC) resistance values of the battery for a predefined time period during one of a constant power charging or discharging window of the battery;

determine the plurality of DC resistance values of the battery, each of the plurality of DC resistance values corresponding to a respective timestamp of a plurality of timestamps corresponding to the predefined time period;

determine a deviation of the determined plurality of DC resistance values by comparing the determined plurality of DC resistance values with a plurality of predefined DC resistance values associated with a reference battery;

detect a persistent short circuit in the battery in response to the determined deviation of the determined plurality of DC resistance values being greater than a threshold value; and estimate, upon detecting the persistent short circuit in the battery, the short resistance of the battery based on a value of power supply in the constant power charging or discharging window and a magnitude of the determined deviation of the determined plurality of DC resistance values with respect to the plurality of predefined DC resistance values.

12. The device of claim 11, wherein the instructions, when executed by the one or more processors, further cause the device to detect that the persistent short circuit is not present in the battery, in response to the determined deviation of the plurality of DC resistance values being less than the threshold value.

13. The device of claim 11, wherein, for the monitoring of the plurality of DC resistance values in the constant power charging or discharging window, the instructions, when executed by the one or more processors, further cause the device to initiate the monitoring from a preset cell voltage value for a preset duration.

14. The device of claim 11, wherein the reference battery corresponds to a healthy battery with the plurality of predefined DC resistance values during the predefined constant power charging or discharging window.

15. The device of claim 11, wherein, for the estimating of the short resistance of the battery, the instructions, when executed by the one or more processors, further cause the device to determine, using an electrochemical-thermal model, the short resistance based on the value of power supply in the constant power and the magnitude of the determined deviation of the determined plurality of DC resistance values with respect to the plurality of predefined DC resistance values at predefined reference operating conditions.

16. The device of claim 11, wherein, for the detecting of the persistent short circuit in the battery, the instructions, when executed by the one or more processors, further cause the device to:

determine a first curve based on the plurality of predefined DC resistance values with respect to the corresponding timestamp of the plurality of timestamps;

generate a second curve based on the determined plurality of DC resistance values with respect to the corresponding timestamp of the plurality of timestamps;

determine a deviation value between the determined first curve and the generated second curve; and detect the persistent short circuit in the battery, in response to the determined deviation value being greater than the threshold value.

17. The device of claim 11, wherein the plurality of DC resistance values corresponds to a ratio of voltage and current applied to the battery at each timestamp of the plurality of timestamps; and the plurality of predefined DC resistance values corresponds to a ratio of voltage and current applied to the reference battery at each timestamp of the plurality of time stamps.

18. The device of claim 11, wherein the battery corresponds to a rechargeable Lithium-ion (Li-ion) battery.

19. The device of claim 11, wherein the instructions, when executed by the one or more processors, further cause the device to display an alert on a display of the battery-based device in response to the estimated short resistance being less than a threshold short resistance value.

20. A processor-implemented method comprising:

determining a plurality of direct current (DC) resistance values of a battery, each of the plurality of DC resistance values corresponding to a respective timestamp of a plurality of timestamps corresponding to a predefined time period during one of a constant power charging or discharging window of the battery;

determining a deviation of the determined plurality of DC resistance values by comparing the determined plurality of DC resistance values with a plurality of predefined DC resistance values associated with a reference battery; and detecting a persistent short circuit in the battery in response to the determined deviation of the determined plurality of DC resistance values being greater than a threshold value.

* * * * *